(12) United States Patent
Zheng et al.

(10) Patent No.: US 11,437,729 B2
(45) Date of Patent: Sep. 6, 2022

(54) TERAHERTZ LEAKY-WAVE ANTENNA MEASURING SYSTEM

(71) Applicant: TSINGHUA UNIVERSITY, Beijing (CN)

(72) Inventors: Xiao-Ping Zheng, Beijing (CN); De-Jian Zhang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 17/173,147

(22) Filed: Feb. 10, 2021

(65) Prior Publication Data

US 2021/0167517 A1 Jun. 3, 2021

Related U.S. Application Data

(63) Continuation of application No. PCT/CN2018/114493, filed on Nov. 8, 2018.

(30) Foreign Application Priority Data

Aug. 23, 2018 (CN) .......................... 201810965187.7

(51) Int. Cl.
| | |
|---|---|
| H01Q 19/15 | (2006.01) |
| H01Q 13/20 | (2006.01) |
| H01Q 19/06 | (2006.01) |
| G01R 29/10 | (2006.01) |

(52) U.S. Cl.
CPC ............ *H01Q 19/15* (2013.01); *G01R 29/10* (2013.01); *H01Q 13/20* (2013.01); *H01Q 19/062* (2013.01)

(58) Field of Classification Search
CPC ....... H01Q 13/20; G01R 29/10; G01R 29/105
See application file for complete search history.

(56) References Cited

U.S. PATENT DOCUMENTS

| | | | |
|---|---|---|---|
| 7,876,276 B1* | 1/2011 | Zaman ..................... | H01Q 3/08 343/703 |
| 9,923,647 B1* | 3/2018 | Olgaard ................ | H04B 17/12 |
| 2005/0128150 A1 | 6/2005 | Chen | |
| 2005/0168209 A1* | 8/2005 | Ryken ................ | G01R 29/0878 324/95 |
| 2010/0328779 A1* | 12/2010 | Llombart Juan ...... | H01Q 19/09 359/619 |
| 2013/0249746 A1 | 9/2013 | Oh et al. | |

(Continued)

FOREIGN PATENT DOCUMENTS

| | | |
|---|---|---|
| CN | 2890939 | 4/2007 |
| CN | 101320062 | 12/2008 |
| CN | 102854401 | 1/2013 |

(Continued)

OTHER PUBLICATIONS

International Search Report of PCT/CN2018/114493.

*Primary Examiner* — Dameon E Levi
*Assistant Examiner* — Leah Rosenberg

(57) ABSTRACT

The present application provides a terahertz leaky-wave antenna measuring system in which an original feed enclosed by a structure is replaced with a probe. The probe is moved along grooves in different directions to acquire amplitude and phase information in real-time to achieve an antenna equivalent measurement according to the reciprocity theorem, wherein the feed and the structure are separated from each other.

18 Claims, 2 Drawing Sheets

(56) References Cited

U.S. PATENT DOCUMENTS

2014/0139382 A1* 5/2014 Chang ................... G01R 29/10
                                                          343/703
2018/0088162 A1* 3/2018 Ndip ..................... H04B 17/27

FOREIGN PATENT DOCUMENTS

| CN | 102854401 A | * | 1/2013 | | |
|---|---|---|---|---|---|
| CN | 105021902 | | 11/2015 | | |
| CN | 106291130 | | 1/2017 | | |
| CN | 206282970 U | * | 6/2017 | | |
| CN | 107390035 | | 11/2017 | | |
| CN | 107942145 | | 4/2018 | | |
| GB | 2254702 A | * | 10/1992 | ............. | G01R 29/10 |
| JP | H06160450 | | 6/1994 | | |
| JP | 2011128131 | | 6/2011 | | |
| JP | 2018063146 | | 4/2018 | | |
| TW | 201421036 | | 6/2014 | | |
| WO | WO-2016128928 A1 | * | 8/2016 | ......... | G01R 29/0871 |

\* cited by examiner

TERAHERTZ LEAKY-WAVE ANTENNA MEASURING SYSTEM

CROSS-REFERENCE TO RELATED APPLICATIONS

This application claims all benefits accruing under 35 U.S.C. § 119 from China Patent Application No. 201810965187.7, filed on Aug. 23, 2018 in the China National Intellectual Property Administration, the content of which is hereby incorporated by reference. This application is a continuation under 35 U.S.C. § 120 of international patent application PCT/CN2018/114493 filed on Nov. 8, 2018, the content of which is also hereby incorporated by reference.

FIELD

The present application relates to the field of antenna measurement, in particular to a terahertz leaky-wave antenna measuring system.

BACKGROUND

The terahertz two-dimensional periodic leaky-wave antenna can have a high directivity under a low profile condition due to the absence of a complicated feeding network and thus has been widely applied in the fields such as terahertz security check, spectrum analysis, and radar. The terahertz two-dimensional periodic leaky-wave antenna has a radiation cavity, i.e., a Fabry-Perot cavity and a feed. Periodic units are attached to a top of the radiation cavity. As on that of the reflector antenna, the location of the feed has a great influence on the performance of the two-dimensional leaky-wave antenna. Generally, in the theoretical design, the whole leaky-wave antenna is optimized after the phase center of the feed is fixed, which is considered as the best feed matching scheme.

However, the phase center of the feed may offset from the optimized location due to the errors caused by the deformation, the assembly, and the like of the antenna occurred under the actual working conditions. Therefore, it is important to determine the optimal location of the feed of the leaky-wave antenna through a measurement in order to obtain a high quality and high efficiency terahertz leaky-wave antenna. In the conventional leaky-wave antenna measuring system, since the feed is integrated into the radiation cavity and is not easy to move, an integrative measurement for the antenna cannot be achieved. Therefore, the conventional leaky-wave antenna measuring system cannot effectively solve the problem of correcting the actual phase center location of the feed of the two-dimension leaky-wave antenna while performing the integrative measurement for the terahertz antenna.

SUMMARY

A terahertz leaky-wave antenna measuring system includes an arched beam, a transmitting device, a radiation cavity, and a probe. The transmitting device is disposed on the arched beam. The radiation cavity is disposed at a center point of an arc defined by the arched beam. A groove is defined in the radiation cavity. The probe is disposed in the groove.

In an embodiment, the groove comprises a first sub-groove extended along a first direction, a second sub-groove extended along a second direction, and a third sub-groove extended along a third direction. The first sub-groove, the second sub-groove, and the third sub-groove are perpendicular to and intersected with each other.

In an embodiment, the transmitting device includes a rotating structure sleeved outside the arched beam and movable along the arched beam.

In an embodiment, the transmitting device includes a transmitting platform fixedly connected to an end of the rotating structure proximate to the radiation cavity.

In an embodiment, the transmitting device includes an adjustable support frame. The adjustable support frame is fixedly connected to the transmitting platform and located between the transmitting platform and the radiation cavity to form an accommodating space surrounded by the adjustable support frame and the transmitting platform.

In an embodiment, the transmitting device further includes a feed disposed on the transmitting platform and located in the accommodating space.

In an embodiment, the transmitting device includes a lens collimator connected to the adjustable support frame and disposed opposite to the feed. The adjustable support frame is configured to adjust a location of the lens collimator with respect to the feed.

In an embodiment, a plurality of metal sheets are disposed and spaced from each other on a surface of the radiation cavity proximate to the transmitting device.

In an embodiment, the terahertz leaky-wave antenna measuring system further includes supporting legs disposed at bottom ends of the arched beam to support the arched beam.

In an embodiment, the terahertz leaky-wave antenna measuring system further includes a wave-absorbing material layer. The wave-absorbing material layer is disposed about the arched beam and the radiation cavity to reduce the noise effect around the terahertz leaky-wave antenna measuring system.

In an embodiment, the terahertz leaky-wave antenna measuring system further includes a test platform disposed adjacent to the center point of the arch to support the radiation cavity thereon.

In an embodiment, the terahertz leaky-wave antenna measuring system further includes a vector network analyzer. A port of the vector network analyzer is connected to the feed, and another port of the vector network analyzer is connected to the probe.

In an embodiment, the terahertz leaky-wave antenna measuring system further includes a controller connected to the vector network analyzer.

In an embodiment, the terahertz leaky-wave antenna measuring system further includes a driving device. An output end of the driving device is connected to the transmitting device, and an input end of the driving device is connected to the computer controller. The driving device is configured to drive the transmitting device to move along the arched beam.

In an embodiment, the probe has a size of 2 mm×1 mm.

In an embodiment, the radiation cavity is a solid member made of a dielectric material.

In an embodiment, the radiation cavity is made of a silicon dielectric material.

In an embodiment, the feed is moved in a range of 0° to 180°.

In an embodiment, the driving device is a stepper motor.

In the terahertz leaky-wave antenna measuring system provided in the present application, the probe is placed in the groove and moved in the groove. The amplitude and phase distribution information of electromagnetic response signals at the locations where the probe arrives during the movement can be acquired by the probe, so that the feed is separated from the radiation cavity. The antenna far-field measurement is realized by extrapolating according to the reciprocity theorem. By directly changing the location of the feed in the transmitting device, the destruction to the original two-dimensional leaky-wave antenna is significantly reduced and the measurement accuracy is increased. Moreover, the system is simple and practicable, and a comprehensive reference can be provided for the feed installation and adjustment.

During the integrative measurement performed by using the terahertz leaky-wave antenna measuring system, the probe can be moved to find the location where a far-field gain of the two-dimensional leaky-wave antenna is maximum to determine the actual phase center location of the feed, thereby effectively solve the problem of correcting the actual phase center location of the feed of the two-dimensional leaky-wave antenna. The terahertz leaky-wave antenna measuring system can be used to measure a radiation property of a two-dimensional leaky-wave antenna at a terahertz wave band or a millimeter wave band and/or measure a transmission property of a frequency-selecting surface without the need of manufacturing a large number of antenna samples to be tested, thereby significantly decreasing the cost.

BRIEF DESCRIPTION OF THE DRAWINGS

To describe the technical solutions in the embodiments of the present application more clearly, the following briefly describes the accompanying drawings referred in the description of the embodiments. The accompanying drawings in the following description show merely some embodiments of the present application, and a person of ordinary skill in the art may derive other drawings from the provided accompanying drawings without creative efforts.

DETAILED DESCRIPTION

The following clearly and completely describes the technical solutions in the embodiments of the present application with reference to the accompanying drawings in the embodiments of the present application. Apparently, the described embodiments are merely some rather than all of the embodiments of the present application. All other embodiments obtained by a person of ordinary skill in the art based on the embodiments of the present application without creative efforts shall fall within the protection scope of the present application.

In order to make the objects, technical solutions, and advantages of the present application more clear, the present application will be further described in detail below with reference to the accompanying drawings and embodiments. It is understood that the specific embodiments described herein are merely illustrative of the application and are not intended to limit the present application.

Figure 1:
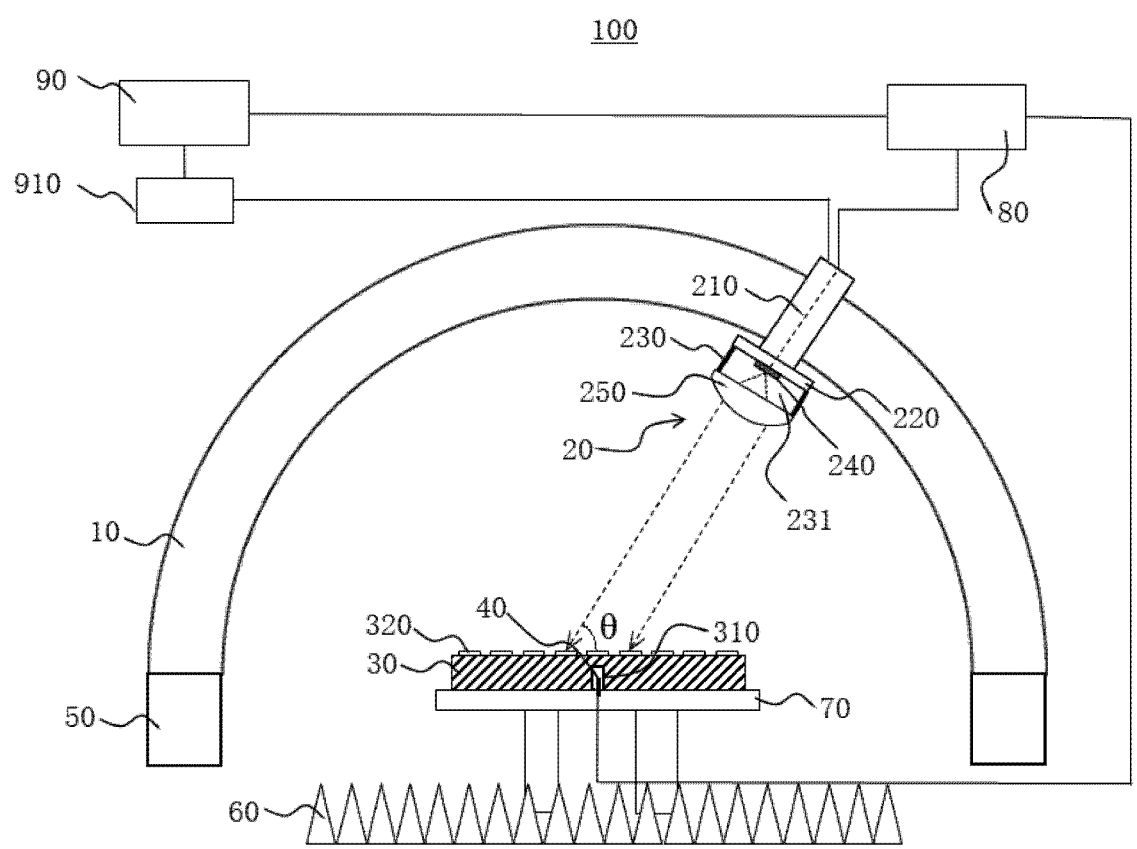
FIG. 1 is a schematic structural view of an embodiment of a terahertz leaky-wave antenna measuring system provided in the present application.

Referring to FIG. 1, the present application provides a terahertz leaky-wave antenna measuring system 100. The terahertz leaky-wave antenna measuring system 100 includes an arched beam 10, a transmitting device 20, a radiation cavity 30, and a probe 40. The transmitting device 20 is disposed on the arched beam 10. The radiation cavity 30 is positioned at a center point of an arc defined by the arched beam 10. A groove 310 is defined in the radiation cavity 30. The probe 40 is disposed in the groove 310. The probe 40 replaces a feed of an original two-dimensional leaky-wave antenna which includes the radiation cavity 30 and the feed located therein.

The transmitting device 20 is mounted to the arched beam 10 and is movable along the arched beam 10 to change an angle θ at which an incident wave is transmitted to the radiation cavity 30. The angle θ is defined between the propagating direction of the incident wave and the top surface of the radiation cavity 30. The transmitting device 20 transmits the incident wave, which is a terahertz signal. The transmitting device 20 can be moved in a range from 0° to 180° of the angle θ around the center point where the radiation cavity 30 is positioned.

According to the reciprocity theorem in the far-field measurement, a far-field intensity of a radiation excited by a feed positioned in the radiation cavity 30 is equal to an intensity of a radiation in the radiation cavity 30 excited by the same feed positioned at the far-field. By placing the probe 40 in the groove 310 and moving the probe 40 along the groove 310, the amplitude and phase distribution information of an electromagnetic response signal generated in response to the incident wave can be acquired at the locations where the probe 40 arrives during the movement, so that the feed is separated from the radiation cavity 30. The antenna far-field measurement is realized by extrapolating according to the reciprocity theorem. By directly changing the location of the feed in the transmitting device 20, the destruction to the original two-dimensional leaky-wave antenna is significantly reduced and the measurement accuracy is increased. Moreover, the system is simple and practicable, and a comprehensive reference can be provided for the feed installation and adjustment.

During the integrative measurement performed by using the terahertz leaky-wave antenna measuring system 100, the probe 40 can be moved to find the location where a far-field gain of the two-dimensional leaky-wave antenna is maximum to determine the actual phase center location, thereby effectively solve the problem of correcting the actual phase center location of the feed of the two-dimension leaky-wave antenna. The terahertz leaky-wave antenna measuring system 100 can be used to measure a radiation property of a two-dimensional leaky-wave antenna at a terahertz wave band or a millimeter wave band and/or measure a transmission property of a frequency-selecting surface without the need of manufacturing a large number of antenna samples to be tested, thereby significantly decreasing the cost.

In an embodiment, the transmitting device 20 includes a rotating structure 210, a transmitting platform 220, an adjustable support frame 230, a feed 240, and a lens collimator 250. The rotating structure 210 is sleeved outside the arched beam 10 and movable along the arched beam 10 to change the angle θ. The transmitting platform 220 is fixedly connected to an end of the rotating structure 210 proximate to the radiation cavity 30. The adjustable support frame 230 is fixedly connected to the transmitting platform 220 and located between the transmitting platform 220 and the radiation cavity 30 to define an accommodating space 231 surrounded by the adjustable support frame 230 and the transmitting platform 220. The feed 240 is disposed on the transmitting platform 220 and located in the accommodating space 231. The adjustable support frame 230 is connected to the lens collimator 250 disposed opposite to the feed 240 to adjust a location of the lens collimator 250.

The rotating structure 210 can be installed onto the arched beam 10 via an engagement between a gear wheel and a gear rack and, driven by a stepper motor, moved along the arched beam 10. The feed 240 is disposed on the transmitting platform 220 to send the terahertz signal. The location of the feed 240 can be calibrated via the lens collimator 250 so that the location of the phase center of the feed 240 coincides with the location of the focus of the lens collimator 250 to allow the incident wave sent at the angle θ to be a plane wave. The adjustable support frame 230 can adjust the location of the lens collimator 250 to adjust a distance between the lens collimator 250 and the feed 240.

The far-field is defined as a region satisfying $R \gg 2D^2/\lambda$, wherein R is a distance from the region to the antenna, $\lambda$ is a wavelength of a wave sent by an antenna in a free space, and D is the maximum overall dimension of the antenna. However, the terahertz leaky-wave antenna is an electrically large structure, and a plane wave beam of relatively good quality can be acquired only when the far-field distance is at least hundreds of meters. The transmitting device 20 adopts the lens collimator 250 to compress the field, so that the volume and space occupation of the terahertz leaky-wave antenna measuring system 100 are reduced.

By adjusting the location of the feed 240 disposed on the transmitting platform 220 and the distance between the adjustable support frame 230 and the feed 240, the phase center of the feed can be adjusted to be located at the focus of the lens collimator 250, so as to obtain a quasi plane wave beam in a relatively large quiet zone. When the phase center location of the feed coincides with the focus location of the lens collimator 250, the incident wave transmitted to the radiation cavity 30 at the angle θ (0° to 180°) is a plane wave. When the probe 40 is moved horizontally in the first sub-groove 311 along the direction X or in the second sub-groove 312 along the direction Y for a distance d, a phase difference ω satisfies:

$$\omega = 2\pi \frac{d}{\lambda} \sin\theta_i.$$

When the probe 40 is moved vertically in the third sub-groove 313 along the direction Z for a distance d, the phase difference ω satisfies:

$$\omega = 2\pi \frac{d}{\lambda} \cos\theta_i.$$

The λ is the wavelength of the incident wave. Therefore, by moving the feed 240 on the transmitting platform 220 to make the phase difference acquired by the probe 40 satisfy the above two equations, the location of the current focus of the lens collimator 250 coincides the location of the phase center of the feed 240.

The terahertz signal is transmitted from the feed 240 and adjusted by the lens collimator 250. The rotating structure 210 can drive the feed 240 to move in the range from 0° to 180°. Since the probe 40 is placed in the groove 310, the probe 40 can be moved in the groove 310 to acquire both the amplitude and phase distribution information of the electromagnetic response signal in real-time at the locations where the probe 40 arrives during the movement, so that the feed 240 is separated from the radiation cavity 30. The antenna far-field measurement is realized by extrapolating according to the reciprocity theorem. During the integrative measurement performed by using the terahertz leaky-wave antenna measuring system 100, the probe 40 is moved to find the location where a far-field gain of the two-dimensional leaky-wave antenna is maximum to determine the actual phase center location of the feed of the two-dimensional leaky-wave antenna. Therefore, the terahertz leaky-wave antenna measuring system 100 can effectively solve the problem of correcting the actual phase center location of the feed of the two-dimension leaky-wave antenna during the integrative measurement for the terahertz antenna.

Figure 2:
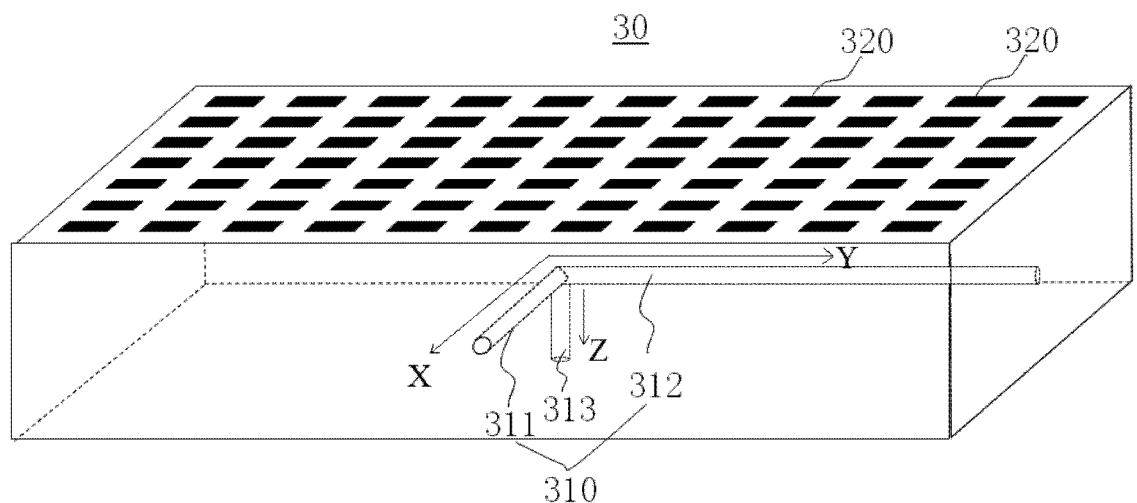
FIG. 2 is a schematic structural view of an embodiment of a radiation cavity of the terahertz leaky-wave antenna measuring system provided in the present application.

Referring to FIG. 2, in an embodiment, the groove 310 includes a first sub-groove 311 extended along a first direction, a second sub-groove 312 extended along a second direction, and a third sub-groove 313 extended along a third direction. The first sub-groove 311, the second sub-groove 312, and the third sub-groove 313 are perpendicular to and intersected with each other.

Wherein the first direction is indicated as the direction X, the second direction is indicated as the direction Y, and the third direction is indicated as the direction Z. The first sub-groove 311, the second sub-groove 312, and the third sub-groove 313 are respectively disposed along the direction X, the direction Y, and the direction Z, are perpendicular to each other, have a common origin, and are configured to receive and move the probe 40.

The radiation cavity 30 is made of a dielectric material such as silicon and has a rectangular cross-section. The first sub-groove 311 along the direction X, the second sub-groove 312 along the direction Y, and the third sub-groove 313 along the direction Z are respectively formed in the radiation cavity 30 by etching, so that the probe 40 can be moved in the radiation cavity 30 along the direction X, the direction Y, or the direction Z. By moving the probe 40 in the radiation cavity 30 along the direction X, the direction Y, and the direction Z, the separation of the feed 240 from the radiation cavity 30 can be realized, and the antenna far-field measurement can be achieved by extrapolating according to the reciprocity theorem. Moreover, a location where the far-field gain is maximum can be found by moving the probe 40, so that the actual phase center location of the feed of the two-dimension leaky-wave antenna can be determined.

Wherein the first sub-groove 311, the second sub-groove 312, and the third sub-groove 313 are disposed in the radiation cavity 30 and located about the theoretical phase center location of the feed of the two-dimension leaky-wave antenna. The theoretical phase center of an antenna is defined as that when an electromagnetic wave radiated by the antenna propagates away from the antenna for a certain distance, an equiphase surface of the electromagnetic wave is approximately a spherical surface, and a center of the spherical surface is the theoretical phase center of the antenna. The probe 40 can be respectively moved along the direction X, the direction Y, and the direction Z in the measurement to determine the actual phase center location of the feed of the two-dimensional leaky-wave antenna.

By forming the grooves along the direction X, the direction Y, and the direction Z by etching the radiation cavity 30, the probe 40 can be moved in different directions. As compared to directly changing the location of the feed in the radiation chamber 30, the degree of damage to the original terahertz leaky-wave antenna structure is significantly decreased, and the measuring accuracy of the terahertz leaky-wave antenna measuring system 100 is increased. Moreover, the terahertz leaky-wave antenna measuring system 100 is simple and practicable in measurement, and a comprehensive reference can be provided for the feed installation and adjustment.

In an embodiment, the probe 40 has a size of 2 mm×1 mm.

In an embodiment, a plurality of metal sheets 320 are disposed and spaced from each other on a surface of the radiation cavity 30 proximate to the transmitting device 20.

The radiation cavity 30 is a solid member made of a dielectric material such as silicon and has a rectangular cross-section. A plurality of rectangular metal sheets 320 are periodically coated onto the surface of the radiation cavity 30, so that a leaky wave radiation can be realized by supporting leaky waves propagating radially along the surface of the radiation cavity 30.

In an embodiment, the terahertz leaky-wave antenna measuring system 100 includes supporting legs 50. The supporting legs 50 are disposed at bottom ends of the arched beam 10 to support the arched beam 10.

In an embodiment, the terahertz leaky-wave antenna measuring system 100 further includes a wave-absorbing material layer 60. The wave-absorbing material layer 60 is disposed around the arched beam 10 and the radiation cavity 30 to reduce the noise effect around the terahertz leaky-wave antenna measuring system 100.

The wave-absorbing material layer 60 is made of a wave-absorbing material and is positioned around the arched beam 10 and the radiation cavity 30, and the wave-absorbing material is thus around the probe 40 to adsorb or significantly reduce the energy of the electromagnetic waves irradiated to the wave-absorbing material surface, thereby reducing the electromagnetic wave interference.

In an embodiment, the terahertz leaky-wave antenna measuring system 100 further includes a test platform 70. The test platform 70 is disposed adjacent to the center point of the arc defined by the arched beam 10 to support the radiation cavity 30 thereon.

In addition, the wave-absorbing material layer 60 is disposed around the test platform 70 to adsorb or significantly reduce the energy of the electromagnetic waves irradiated to the wave-absorbing material surface, thereby reducing the electromagnetic wave interference.

In an embodiment, the terahertz leaky-wave antenna measuring system 100 further includes a vector network analyzer 80. A port of the vector network analyzer 80 is connected to the feed 240, and another port of the vector network analyzer 80 is connected to the probe 40.

The vector network analyzer 80 is an apparatus for testing the electromagnetic wave energy and can measure both the amplitude and the phase. By connecting the vector network analyzer 80 to the feed 240 and the probe 40, the amplitude and phase distribution information and variation of the electromagnetic response signal at locations where the probe arrives at can be acquired.

In an embodiment, the terahertz leaky-wave antenna measuring system 100 further includes a controller 90. The controller 90 is connected to the vector network analyzer 80. The controller 90 can be a computer and is used to process data and control the stepper motor to drive the rotating structure 210 to move along the arched beam 10.

The terahertz signal is generated by a terahertz signal source, transmitted from the feed 240 connected to the vector network analyzer 80, converted into the quasi plane wave by the lens collimator 250, and then irradiated to the radiation cavity 30 on the test platform 70. A part of the energy is transmitted to the probe 40 located in the radiation cavity 30. The information corresponding to the transmitted signal is sent to the controller 90 via the probe 40 and the vector network analyzer 80. The vector network analyzer 80 processes the acquired data to acquire the amplitude and phase distribution information of the electromagnetic response signal acquired by the probe at the locations where the probe 40 arrives and send the amplitude and phase distribution information to the controller 90. The controller 90 processes the information and converts the information into the far-field information to obtain the far-field property.

In addition, an antenna far-field radiation pattern under the current phase center condition can be acquired by extrapolating according to the reciprocity theorem with the obtained far-field property, so that the radiation properties such as the radiation pattern, the gain, and the axis ratio of the leaky-wave antenna can be acquired.

In an embodiment, the terahertz leaky-wave antenna measuring system 100 further includes a driving device 910. An output end of the driving device 910 is connected to the transmitting device 20, and an input end of the driving device 910 is connected to the computer controller 90, to drive the transmitting device 20 to move along the arched beam 10.

The driving device 910 can be a stepper motor. The rotating structure 210 can be installed onto the arched beam 10 via an engagement between a gear wheel and a gear rack, driven by a stepper motor, and moved along the arched beam 10. The driving device 910 is connected to the controller 90. The stepper motor can be controlled by the controller 90 through programming so as to move the rotating structure 210. The movement of the transmitting device 20 on the arched beam 10 can be controlled by the controller 90 and the driving device 910, so that the incident angle θ can be changed in a range from 0° to 180°, achieving the oblique incidence at different angles, increasing the angle control accuracy of the terahertz leaky-wave antenna measuring system 100, and realizing more intellectualized operations.

When the terahertz leaky-wave antenna measuring system 100 performs the measurement, the feed 240 is firstly fixed onto the transmitting platform 220. Then the probe 40 in the radiation cavity 30 disposed on the test platform 70 is moved for sampling. The phase center location of the feed 240 is calculated according to the sampling result, so that the location of the feed 240 can be adjusted to allow the phase center location of the feed 240 to coincide with the focus location of the lens collimator 250. In this case, when the probe 40 is moved in a given range, the acquired amplitude and phase of the electromagnetic response signal is varied according to the incidence condition of the plane wave. It is not required to manufacture a large number of antenna samples to be tested, thereby significantly reducing the cost.

The calibration is finished when the phase center location of the feed coincides with the focus location of the lens collimator 250. In this case, the terahertz signal is generated by the terahertz signal source, transmitted from the feed 240, converted into the quasi plane wave by the lens collimator 250, and irradiated to the test platform. A part of the energy is transmitted to the probe 40 located in the radiation cavity 30. The information corresponding to the transmitted signal is sent to the controller 90 via the probe 40 and the vector network analyzer 80. Through the above-described method, the amplitude and phase distribution information of the electromagnetic response signal can be acquired at the incident angle θ of 0° to 180° at the locations where the probe 40 arrives. Then the antenna far-field radiation pattern under the current phase center condition can be acquired by extrapolating according to the reciprocity theorem.

Through the above-described method, the probe 40 is regularly moved about the theoretical phase center of the terahertz leaky-wave antenna in the first sub-groove 311, the second sub-groove 312, and the third sub-groove 313 (i.e., along the direction X, the direction Y, and the direction Z) to acquire the amplitudes of the electromagnetic response signal via the probe 40, and the information of the amplitudes is then transmitted to the controller 90 through the vector network analyzer 80 and compared to obtain the location of the probe 40 where the acquired amplitude is maximum, i.e., where the far-field gain of the terahertz leaky-wave antenna is maximum. This location is the ideal phase center location of the terahertz leaky-wave antenna.

Figure 3:
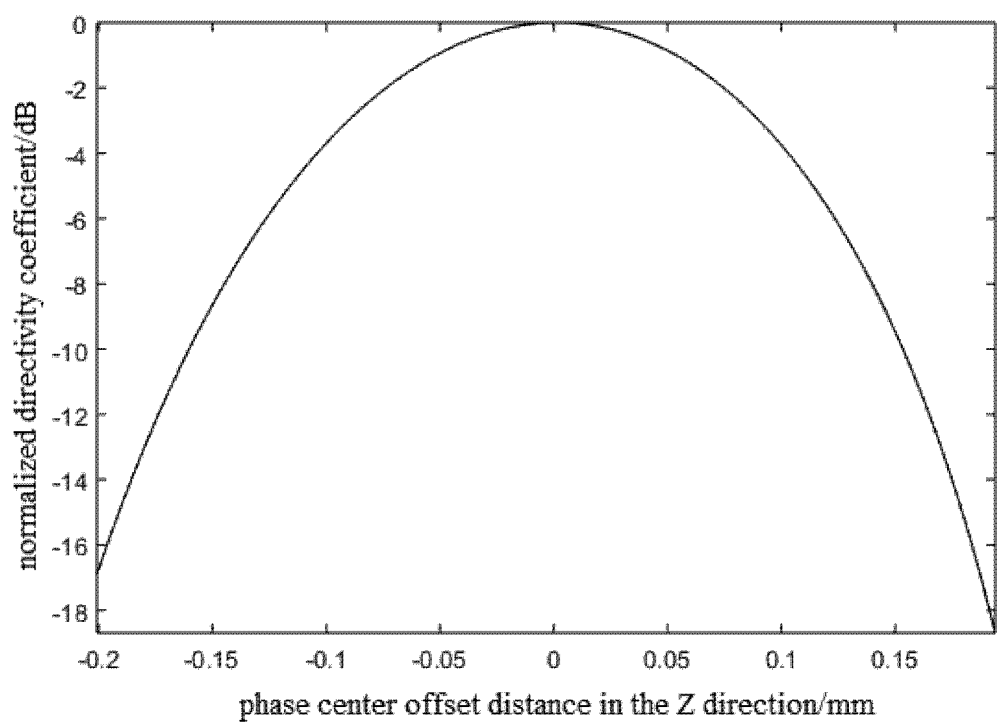
FIG. 3 is a diagram showing the phase center offset and the gain of an embodiment of the terahertz leaky-wave antenna measuring system provided in the present application.

FIG. 3 shows a relationship between an offset distance of the phase center in the direction Z and the normalized directivity coefficient according to an embodiment. The FIG. 3 demonstrates that the variation in the direction Z is very sensitive, and the gain is maximum when there is no phase center offset.

The technical features of the above-described embodiments may be arbitrarily combined. In order to make the description simple, not all possible combinations of the technical features in the above embodiments are described. However, as long as there is no contradiction in the combination of these technical features, the combinations should be in the scope of the present application.

What described above are only several implementations of the present application, and these embodiments are specific and detailed, but not intended to limit the scope of the present application. It should be understood by a person of ordinary skill in the art that various modifications and improvements can be made without departing from the conception of the present application, and all fall within the protection scope of the present application. Therefore, the patent protection scope of the present application is defined by the appended claims In the present application, the relational terms such as "first" and "second" are used to differentiate an entity or operation from another entity or operation, and do not require or imply any actual relationship or sequence between these entities or operations. Moreover, the terms "include", "comprise" and any variation thereof are intended to cover a non-exclusive inclusion. Therefore, a process, method, object, or device, which includes a series of elements, not only includes such elements, but also includes other elements not specified expressly, or may further include inherent elements of the process, method, object, or device. If no more limitations are made, an element limited by "include a/an . . . " does not exclude other same elements existing in the process, the method, the article, or the device which includes other elements.

The various embodiments of the present application are described progressively, where each embodiment is described by emphasizing its differences form some other embodiments. For portions of the various embodiments that are similar to each other, references can be made to each other.

The descriptions of the provided embodiments enable those skilled in the art to implement or use this application. Various modifications to these embodiments will be apparent to those skilled in the art. The general principles defined herein can be implemented in other embodiments without departing from the spirit or scope of the present application. Therefore, the present application will not be limited to the embodiments illustrated in this application, but should conform to the widest scope consistent with the principles and novel features provided herein.

What is claimed is:

1. A terahertz leaky-wave antenna measuring system, comprising:
    an arched beam;
    a transmitting device disposed on the arched beam;
    a radiation cavity disposed at a center point of an arc defined by the arched beam, a groove being defined in the radiation cavity; and
    a probe disposed in the groove;
    wherein the groove comprises a first sub-groove extended along a first direction, a second sub-groove extended along a second direction, and a third sub-groove extended along a third direction; and the first sub-groove, the second sub-groove, and the third sub-groove are perpendicular to and intersected with each other.

2. The terahertz leaky-wave antenna measuring system of claim 1, wherein the transmitting device comprises:
    a rotating structure sleeved outside the arched beam and movable along the arched beam.

3. The terahertz leaky-wave antenna measuring system of claim 2, wherein the transmitting device comprises:
    a transmitting platform fixedly connected to an end of the rotating structure proximate to the radiation cavity.

4. The terahertz leaky-wave antenna measuring system of claim 3, wherein the transmitting device comprises:
    an adjustable support frame fixedly connected to the transmitting platform and located between the transmitting platform and the radiation cavity to form an accommodating space surrounded by the adjustable support frame and the transmitting platform.

5. The terahertz leaky-wave antenna measuring system of claim 4, wherein the transmitting device comprises:
    a feed disposed on the transmitting platform and located in the accommodating space.

6. The terahertz leaky-wave antenna measuring system of claim 5, wherein the transmitting device comprises:
    a lens collimator connected to the adjustable support frame and disposed opposite to the feed;
    wherein the adjustable support frame is configured to adjust a location of the lens collimator with respect to the feed.

7. The terahertz leaky-wave antenna measuring system of claim 1, further comprising:
    a plurality of metal sheets disposed and spaced from each other on a surface of the radiation cavity proximate to the transmitting device.

8. The terahertz leaky-wave antenna measuring system of claim 1, further comprising:
    supporting legs disposed at bottom ends of the arched beam to support the arched beam.

9. The terahertz leaky-wave antenna measuring system of claim 1, further comprising:
    a wave-absorbing material layer disposed about the arched beam and the radiation cavity.

10. The terahertz leaky-wave antenna measuring system of claim 1, further comprising:
    a test platform disposed adjacent to the center point of the arc to support the radiation cavity thereon.

11. The terahertz leaky-wave antenna measuring system of claim 5, further comprising:
    a vector network analyzer, wherein a port of the vector network analyzer is connected to the feed, and another port of the vector network analyzer is connected to the probe.

12. The terahertz leaky-wave antenna measuring system of claim 11, further comprising:
    a controller connected to the vector network analyzer.

13. The terahertz leaky-wave antenna measuring system of claim 12, further comprising:
a driving device to drive the transmitting device to move along the arched beam, wherein an output end of the driving device is connected to the transmitting device, and an input end of the driving device is connected to the controller.

14. The terahertz leaky-wave antenna measuring system of claim 1, wherein the probe has a size of 2 mm×1 mm.

15. The terahertz leaky-wave antenna measuring system of claim 1, wherein the radiation cavity is a solid member made of a dielectric material.

16. The terahertz leaky-wave antenna measuring system of claim 15, wherein the dielectric material is silicon.

17. The terahertz leaky-wave antenna measuring system of claim 1, wherein the transmitting device is configured to moved in a range from 0° to 180° around the center point of the arc.

18. The terahertz leaky-wave antenna measuring system of claim 13, wherein the driving device is a stepper motor.

* * * * *